(12) United States Patent
Miura et al.

(10) Patent No.: US 10,374,523 B2
(45) Date of Patent: Aug. 6, 2019

(54) POWER CONVERSION DEVICE

(71) Applicants: TOYOTA JIDOSHA KABUSHIKI KAISHA, Toyota-shi, Aichi-ken (JP); DENSO CORPORATION, Kariya, Aichi-pref. (JP)

(72) Inventors: Shinichi Miura, Toyota (JP); Hiroki Umeda, Toyota (JP); Kenshi Yamanaka, Nukata-gun (JP); Yutaka Morimoto, Toyokawa (JP); Kazuki Hayashi, Toyota (JP); Hiromi Yamasaki, Toyota (JP); Hitoshi Imura, Chiryu (JP); Tomohisa Sano, Kariya (JP); Daisuke Harada, Kariya (JP); Hideaki Tachibana, Kariya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 16/209,002

(22) Filed: Dec. 4, 2018

(65) Prior Publication Data

US 2019/0173394 A1 Jun. 6, 2019

(30) Foreign Application Priority Data

Dec. 4, 2017 (JP) .................................. 2017-232659
Jun. 26, 2018 (JP) .................................. 2018-120958

(51) Int. Cl.
*H02M 7/515* (2007.01)
*H02M 1/08* (2006.01)
(Continued)

(52) U.S. Cl.
CPC ......... *H02M 7/515* (2013.01); *B60L 11/1803* (2013.01); *H02M 1/08* (2013.01);
(Continued)

(58) Field of Classification Search
CPC .... H02M 7/515; H02M 7/483; H05K 5/0217; H05K 5/006; H05K 7/142
(Continued)

(56) References Cited

U.S. PATENT DOCUMENTS

2014/0160822 A1* 6/2014 Kuwano ............... H02M 7/003
363/141

FOREIGN PATENT DOCUMENTS

| JP | 2015-126674 A | 7/2015 |
| JP | 2017-050486 A | 3/2017 |
| JP | 2017-121867 A | 7/2017 |

* cited by examiner

*Primary Examiner* — Adolf D Berhane
*Assistant Examiner* — Afework S Demisse
(74) *Attorney, Agent, or Firm* — Oliff PLC

(57) ABSTRACT

A power conversion device includes a case including an upper case and a lower case; an inverter that is accommodated in a first partial case and is fixed to the first partial case, the first partial case being one of the upper case and the lower case; and a capacitor that is connected to the inverter by a positive electrode bus bar and a negative electrode bus bar, the capacitor being disposed in an internal space of a second partial case that is another of the upper case and the lower case. The first partial case includes a fastening portion that extends from an internal space of the first partial case to the internal space of the second partial case. In the internal space of the second partial case, the capacitor is fastened to the fastening portion.

4 Claims, 8 Drawing Sheets

(51) Int. Cl.
    *H05K 5/02*          (2006.01)
    *B60L 11/18*        (2006.01)
    *H02M 7/483*       (2007.01)

(52) U.S. Cl.
    CPC .......... *H02M 7/483* (2013.01); *H05K 5/0217* (2013.01); *B60L 2210/40* (2013.01); *H02M 2007/4835* (2013.01)

(58) Field of Classification Search
    USPC ........................................................ 361/763
    See application file for complete search history.

POWER CONVERSION DEVICE

INCORPORATION BY REFERENCE

The disclosure of Japanese Patent Application No. 2018-120958 filed on Jun. 26, 2018 including the specification, drawings and abstract is incorporated herein by reference in its entirety.

BACKGROUND

1. Technical Field

The disclosure relates to a power conversion device that includes an inverter and a capacitor.

2. Description of Related Art

A power conversion device including an inverter and a capacitor is described in each of Japanese Patent Application Publication No. 2017-050486 (JP 2017-050486 A) and Japanese Patent Application Publication No. 2015-126674 (JP 2015-126674 A). In an electric vehicle, the power conversion device converts direct-current (DC) power from a battery to alternate-current (AC) power suitable for driving a motor. The capacitor is provided to smooth pulsations of a current that is input to a DC end of the inverter. The inverter and the capacitor are electrically connected by a metal-plate conductive member called a bus bar.

In the power conversion device described in each of JP 2017-050486 A and JP 2015-126674 A, the inverter and the capacitor are arranged adjacent to each other in a horizontal direction. Due to various reasons, a case is divided into an upper case and a lower case in an up-down direction, and electrical components are accommodated and fixed in the upper case and the lower case and connected by the bus bar. Such a device is described in Japanese Patent Application Publication No. 2017-121867 (JP 2017-121867 A).

SUMMARY

Because the power conversion device for a travel motor of the electric vehicle handles a large amount of electric power, a large-sized capacitor is provided in the power conversion device. For example, when a ratio of the width of the case in the horizontal direction to the height of the case is reduced, the inverter and the capacitor cannot be aligned in the horizontal direction. Consequently, the inverter and the capacitor need to be aligned in a vertical direction. In the case where one of the inverter and the capacitor is fixed to the upper case and the other is fixed to the lower case, the ease, with which the inverter and the capacitor are connected by the bus bar, decreases (in other words, it is difficult to connect the inverter and the capacitor with the use of the bus bar). For example, in the case where both of the inverter and the capacitor are fixed to the upper case, the capacitor is fixed to the upper case and is disposed in an internal space of the lower case. Typically, an upper end of the capacitor is fastened to a fastening seat provided in the upper case. However, in such a structure, the capacitor is supported at only the upper end in a cantilevered manner, and thus the structure exhibits a poor anti-vibration characteristic.

The disclosure relates to a power conversion device in which an inverter and a capacitor are accommodated in a case including an upper case and a lower case, and provides a technique of simultaneously reducing a ratio of the width of the case to the height of the case and preventing degradation of an anti-vibration characteristic of the capacitor. The disclosure also provides a technique of reducing inductance of a bus bar that connects the inverter and the capacitor.

A power conversion device described in the disclosure includes a case including an upper case and a lower case that are arranged in an up-down direction; an inverter; and a capacitor. For convenience of the description, one of the upper case and the lower case will be referred to as a first partial case, and the other of the upper case and the lower case will be referred to as a second partial case. The inverter is accommodated and fixed in the first partial case. The capacitor is connected to the inverter by a positive electrode bus bar and a negative electrode bus bar. The first partial case includes a fastening portion that extends from an internal space of the first partial case to an internal space of the second partial case. In the internal space of the second partial case, the capacitor is fastened to the fastening portion. That is, the capacitor is accommodated in the internal space of the second partial case.

In order to facilitate understanding of the description, it is assumed that the upper case is the first partial case. The lower case corresponds to the second partial case. In the power conversion device described in the disclosure, the inverter is accommodated in the internal space of the upper case, and the capacitor is disposed in the internal space of the lower case. Because the inverter and the capacitor do not need to be aligned in a horizontal direction, a ratio of the width of the case to the height of the case can be reduced. In addition, both of the inverter and the capacitor that are connected by the bus bars are fixed to the upper case. Thus, the inverter and the capacitor can be connected to each other before the upper case and the lower case are connected. Thus, an assembly process can be performed easily (i.e., the inverter and the capacitor can be connected to each other easily). The capacitor is fastened in the internal space of the lower case. Thus, the capacitor can be fastened at a substantially center thereof in the up-down direction, and an anti-vibration characteristic of the capacitor is not degraded. The power conversion device described in the disclosure can make it possible to simultaneously reduce the ratio of the width of the case to the height of the case and to prevent the degradation of the anti-vibration characteristic of the capacitor.

The positive electrode bus bar and the negative electrode bus bar may be arranged close to each other so as to extend in parallel from the capacitor toward the inverter. In the case where the positive electrode bus bar and the negative electrode bus bar are arranged close to each other so as to extend in parallel, the induced magnetic field at the time when a current flows through one of the bus bars is reduced by the other bus bar. Thus, parasitic inductance of the bus bar is reduced.

The inverter includes a stacked body including a plurality of power modules and a plurality of coolers. One example of the power module may include a package and a plurality of terminals, the package accommodating a switching element, and each of the plurality of terminals extending from the package and being connected to the positive electrode bus bar or the negative electrode bus bar. A clearance is provided between the package and the capacitor when the package and the capacitor are seen in the horizontal direction. That is, the package and the capacitor are separated from each other in the up-down direction when the package and the capacitor are seen in the horizontal direction. Due to this arrangement, the terminals of the power module and the capacitor can be connected by the linear bus bars (the positive electrode bus bar and the negative electrode bus bar). By adopting the linear bus bars, the inductance of each of the bus bars is reduced.

In a section of the capacitor that is orthogonal to a stacking direction of the plurality of power modules, a length of the capacitor in a lateral direction may be less than a length of the capacitor in a vertical direction. Electrodes that are connected to the positive electrode bus bar and the negative electrode bus bar may be arranged on side surfaces of the capacitor, the side surfaces facing in the lateral direction. Since the positive electrode bus bar and the negative electrode bus bar are arranged close to each other so as to extend in parallel, the inductance thereof is reduced. Due to the above arrangement of the electrodes in the capacitor, a zone in which the positive electrode bus bar and the negative electrode bus bar do not extend in parallel with each other has only a distance (length) corresponding to the length of the capacitor in the lateral direction (in other words, the positive electrode bus bar and the negative electrode bus bar do not extend in parallel with each other only in the zone having the distance (length) corresponding to the length of the capacitor in the lateral direction. Thus, the inductance of each of the bus bars is reduced.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
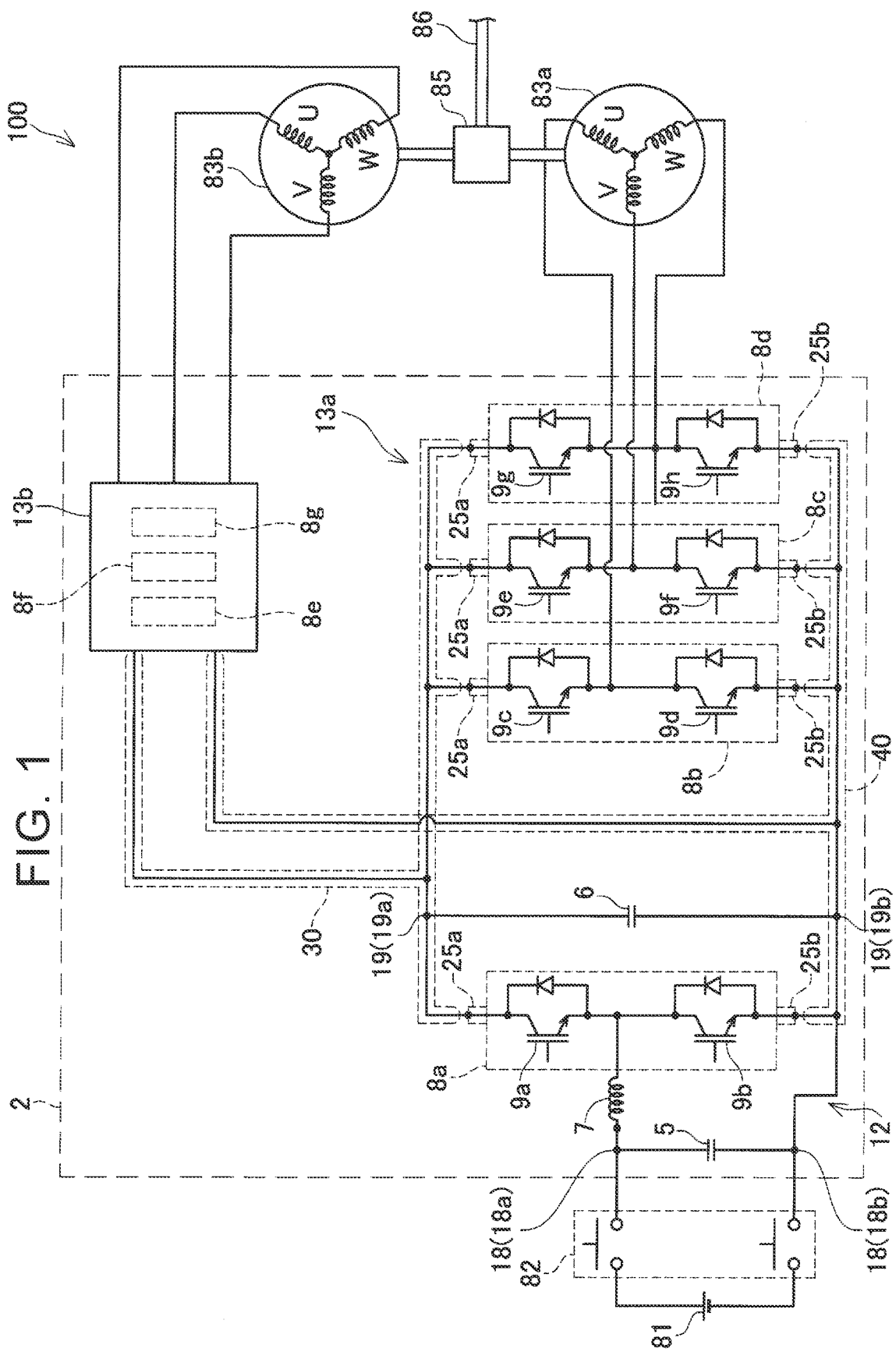
FIG. 1 is a block diagram of an electric system of an electric vehicle, the electric system including a power conversion device according to a first embodiment.

A description will be provided on a power conversion device according to a first embodiment with reference to the drawings. The power conversion device of the embodiment is a device that is mounted in an electric vehicle and converts battery power (electric power from a battery) to drive electric power for a travel motor (i.e., a motor for traveling). FIG. 1 is a block diagram of an electric system in an electric vehicle 100, and the electric system includes a power conversion device 2. The electric vehicle 100 includes two travel motors 83a, 83b. Thus, the power conversion device 2 includes two inverter circuits 13a, 13b. Output of the two motors 83a, 83b is combined in a gearbox 85 and is then transmitted to an axle 86 (that is, drive wheels).

The power conversion device 2 is connected to a battery 81 via a system main relay 82. The power conversion device 2 includes: a voltage converter circuit 12 that boosts a voltage of the battery 81; and the two inverter circuits 13a, 13b, each of which converts boosted direct-current (DC) power to alternate-current (AC) power.

The voltage converter circuit 12 is a bidirectional DC/DC converter configured to perform both of a voltage boosting operation and a voltage lowering operation. In the voltage boosting operation, the voltage converter circuit 12 boosts a voltage that is applied to a terminal on the battery 81-side, and outputs the boosted voltage to a terminal on an inverter side. In the voltage lowering operation, the voltage converter circuit 12 lowers the voltage that is applied to the terminal on the inverter side, and outputs the lowered voltage to the terminal on the battery 81-side. For convenience of the description, hereinafter, the terminal on the battery 81-side (a low voltage side) will be referred to as an input end 18, and the terminal on the inverter side (a high voltage side) will be referred to as an output end 19. A positive electrode and a negative electrode of the input end 18 will be referred to as an input positive electrode end 18a and an input negative electrode end 18b. A positive electrode and a negative electrode of the output end 19 will be referred to as an output positive electrode end 19a and an output negative electrode end 19b. The terms "input end 18" and "output end 19" are used for convenience of the description. As described above, the voltage converter circuit 12 is the bidirectional DC/DC converter, and thus, there is a case where the electric power flows from the output end 19 to the input end 18.

The voltage converter circuit 12 includes a series circuit including two switching elements 9a, 9b; a reactor 7; a filter capacitor 5; and diodes that are respectively connected to the switching elements 9a, 9b in an inverse-parallel manner. One end of the reactor 7 is connected to the input positive electrode end 18a, and the other end thereof is connected to a midpoint of the series circuit. The filter capacitor 5 is connected between the input positive electrode end 18a and the input negative electrode end 18b. The input negative electrode end 18b is directly connected to the output negative electrode end 19b. The switching element 9b is mainly involved in the voltage boosting operation, and the switching element 9a is mainly involved in the voltage lowering operation. The voltage converter circuit 12 in FIG. 1 is well known, and thus a detailed description thereof will not be provided. The circuit within a broken line rectangular area, which is denoted by the reference numeral and symbol 8a, corresponds to a power module 8a, which will be described below. The reference numerals and symbols 25a, 25b denote terminals that extend from the power module 8a. The reference numeral and symbol 25a denote a terminal (a positive electrode terminal 25a) that is electrically connected to a high potential side of the series circuit including the switching elements 9a, 9b. The reference numeral and symbol 25b denote a terminal (a negative electrode terminal 25b) that is electrically connected to a low potential side of the series circuit including the switching elements 9a, 9b. As will be described next, the terms "positive electrode terminal 25a" and "negative electrode terminal 25b" will also be used for the other power modules.

The inverter circuit 13a has a configuration that three series circuits, each of which includes two switching elements, are connected in parallel. Switching elements 9c, 9d constitute the series circuit, switching elements 9e, 9f constitute the series circuit, and switching elements 9g, 9h constitute the series circuit. The diodes are respectively connected to the switching elements in the inverse-parallel manner. A terminal (the positive electrode terminal 25a) on the high potential side of each of the three series circuits is connected to the output positive electrode end 19a of the voltage converter circuit 12. A terminal (the negative electrode terminal 25b) on the low potential side of each of the three series circuits is connected to the output negative electrode end 19b of the voltage converter circuit 12. Three-phase alternating currents (U-phase, V-phase, and W-phase) are output from midpoints of the three series circuits. The three series circuits respectively correspond to power modules 8b, 8c, 8d, which will be described below.

Because the inverter circuit 13b has the same configuration as the inverter circuit 13a, circuits in the inverter circuit 13b are not specifically shown in FIG. 1. Similarly to the inverter circuit 13a, the inverter circuit 13b also has a configuration in which three series circuits, each of which includes two switching elements, are connected in parallel. A terminal on the high potential side of each of the three series circuits is connected to the output positive electrode end 19a of the voltage converter circuit 12. A terminal on the low potential side of each of the three series circuits is connected to the output negative electrode end 19b of the voltage converter circuit 12. Hardware units that correspond to the series circuits will be referred to as power modules 8e, 8f, 8g.

A smoothing capacitor 6 is connected in parallel to input ends of the inverter circuits 13a, 13b. In other words, the smoothing capacitor 6 is connected in parallel to the output end 19 of the voltage converter circuit 12. The smoothing capacitor 6 eliminates pulsations of the current flowing between the voltage converter circuit 12 and the inverter circuits 13a, 13b.

Each of the switching elements 9a to 9h is a transistor and typically an insulated-gate bipolar transistor (IGBT). However, each of the switching elements 9a to 9h may be another transistor such as a metal-oxide-semiconductor field-effect transistor (MOSFET). In addition, the switching element described herein is used for power conversion and is also referred to as a power semiconductor element. The same applies to the switching elements that are provided in the power modules 8e to 8g.

In FIG. 1, each of the broken lines 8a to 8g corresponds to the power module. The power conversion device 2 includes seven series circuits, each of which includes the two switching elements. In each of the hardware units, the two switching elements, which constitute the series circuit, and the diodes, which are respectively connected to the switching elements in the inverse-parallel manner, are accommodated in a single package. In the case where the power modules 8a to 8g are not distinguished from each other, the power modules 8a to 8g will be hereinafter described as power modules 8.

In each of the seven power modules 8 (each of the seven series circuits), the terminal on the high potential side (the positive electrode terminal 25a) is connected to a positive electrode of the smoothing capacitor 6, and the terminal on the low potential side (the negative electrode terminal 25b) is connected to a negative electrode of the smoothing capacitor 6. In FIG. 1, a conductive path within a broken line area denoted by the reference numeral 30 corresponds to a bus bar (a positive electrode bus bar) that mutually connects each of the positive electrode terminals 25a in the plurality of power modules 8 and the positive electrode of the smoothing capacitor 6. A conductive path within a broken line area denoted by the reference numeral 40 corresponds to a bus bar (a negative electrode bus bar) that mutually connects each of the plurality of negative electrode terminal 25b and the negative electrode of the smoothing capacitor 6. Next, a description will be provided on structures of the plurality of power modules 8, the positive electrode bus bar 30, and the negative electrode bus bar 40.

Figure 2:
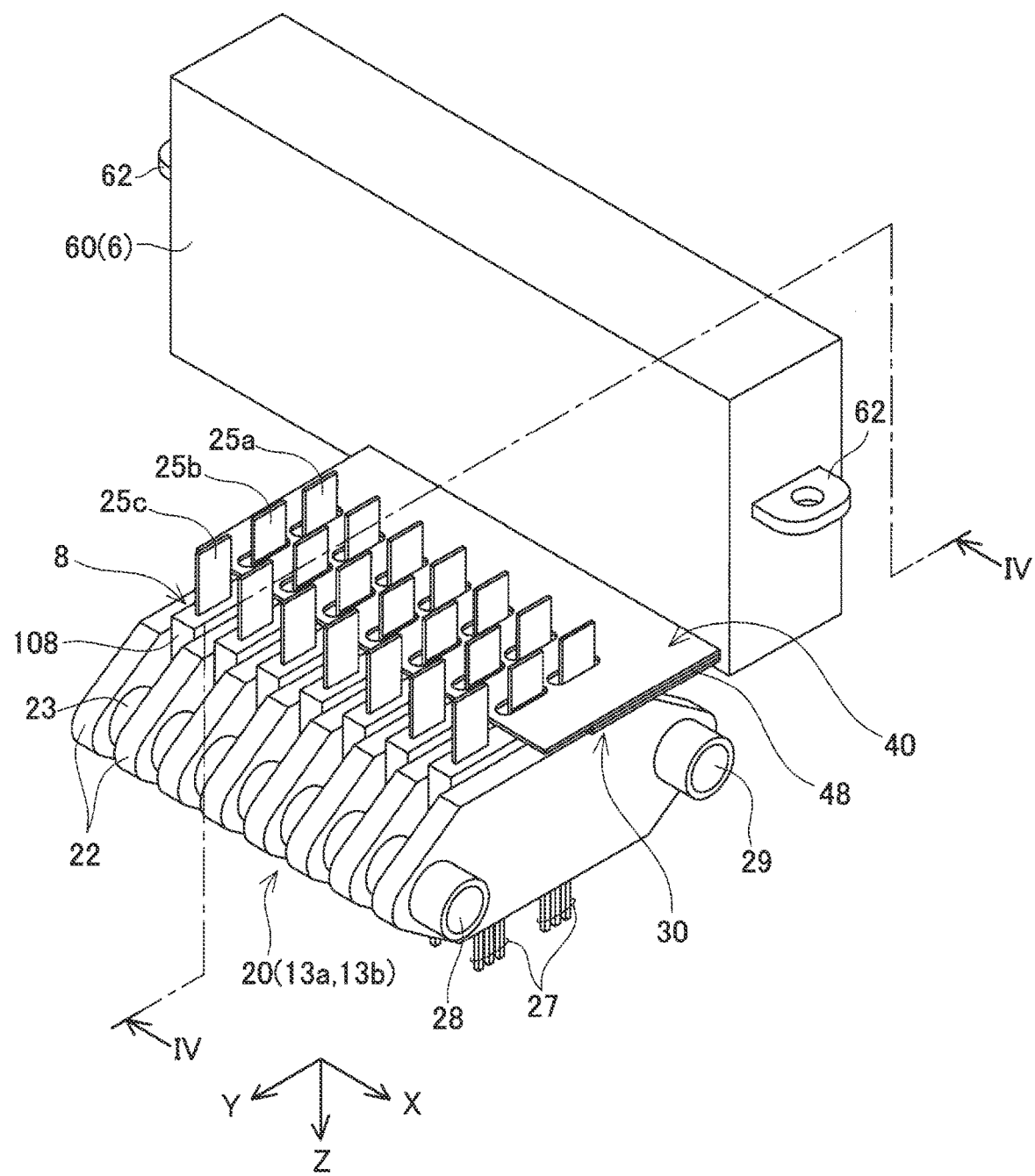
FIG. 2 is a perspective view of an assembly of a stacked unit, bus bars, and a capacitor.

FIG. 2 is a perspective view of the hardware unit as a part of the power conversion device 2. FIG. 2 is a perspective view of an assembly of a stacked unit 20 and a capacitor 60 that are connected by the bus bars 30, 40. The stacked unit 20 is a device in which the above-described power modules 8 (8a to 8g) and a plurality of coolers 22 are stacked. The capacitor 60 is a device in which a capacitor element corresponding to the smoothing capacitor 6 in FIG. 1 is sealed.

Figure 3:
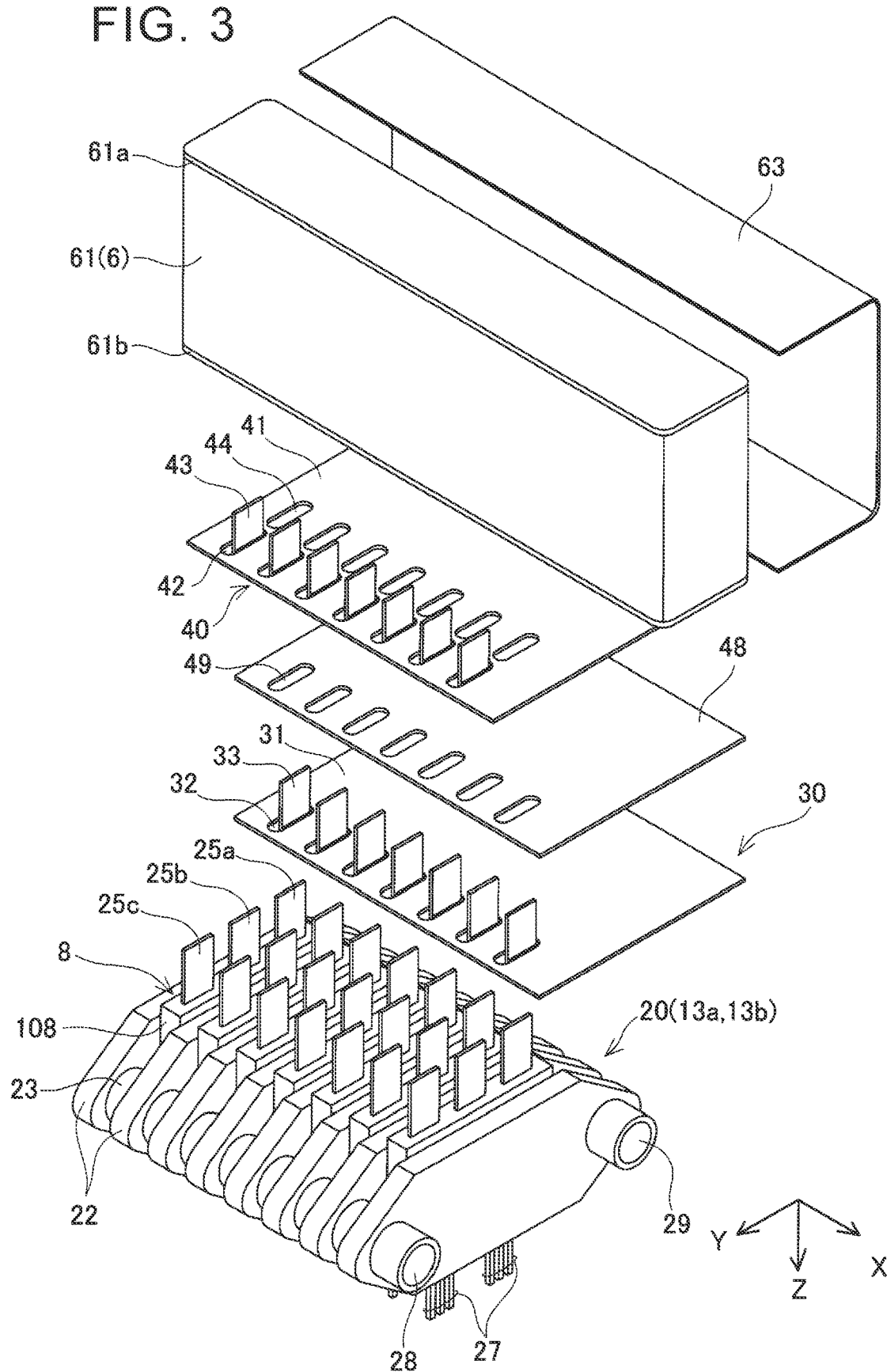
FIG. 3 is an exploded perspective view of the assembly of the stacked unit, the bus bars, and the capacitor.

The plurality of power modules 8 (8a to 8g) and the plurality of coolers 22 constitute the stacked unit 20. In FIG. 2 and FIG. 3, which will be described below, because the power modules 8a to 8g have the same shape, only the power module at a left end is representatively denoted by the reference numeral 8, and the other power modules are not denoted by the reference numeral. In addition, in FIG. 2 and FIG. 3, which will be described below, only the two coolers at the left end are representatively denoted by the reference numeral 22, and the other coolers are not denoted by the reference numeral.

The stacked unit 20 includes almost all main components of the inverter circuits 13a, 13b in FIG. 1. For this reason, the stacked unit 20 may be referred to as an "inverter". Thus, in FIG. 2 and FIG. 3, the reference numerals and symbols 13a, 13b in parentheses are added to the reference numeral of the stacked unit 20.

A coordinate system shown in FIG. 2 will be described. A positive direction of a Z-axis in the coordinate system shown in FIG. 2 corresponds to an "upward direction" of the power conversion device 2. That is, FIG. 2 (and FIG. 3, which will be described below) shows the assembly of the stacked unit 20 and the capacitor 60, the assembly being obliquely seen from below.

The stacked unit 20 is a device in which the plurality of card-type (i.e., card-shaped) coolers 22 are arranged in parallel and each of the card-type (i.e., card-shaped) power modules 8 is held between the adjacent coolers 22. The card-type power modules 8 are stacked such that wide surfaces thereof face the coolers 22. As described above, the power module 8 has a package 108 that accommodates the switching elements. The package 108 is made of a resin. In each power module 8, three terminals (the positive electrode terminal 25a, the negative electrode terminal 25b, and a midpoint terminal 25c) extend from a side surface (a lower surface) of the package 108. In FIG. 2 and FIG. 3, which will be described below, only the terminals of the power module 8 that is located at the left end of the stacked unit 20 are denoted by the reference numerals and symbols 25a, 25b, 25c, and the terminals of the other power modules 8 are not denoted by the reference numerals and symbols.

As described above, the positive electrode terminal 25a and the negative electrode terminal 25b are the terminals on the high potential side and the low potential side of the series circuit that is accommodated in the power module 8. The midpoint terminal 25c is the terminal that is electrically connected to the midpoint of the series circuit. In other words, each of the three terminals 25a to 25c is electrically connected to the switching element in the power module 8. The three terminals 25a to 25c extend in a negative direction of the Z-axis in FIG. 2 (that is, downward) from the side surface (the lower surface), which crosses the wide surfaces of the power module 8 (note that FIG. 2 shows the stacked unit 20 that is obliquely seen from below). A plurality of control terminals 27 extend in the positive direction of the Z-axis in FIG. 2 (that is, upward) from a surface (an upper surface) opposite to the side surface provided with the positive electrode terminal 25a and the like. The control terminals 27 include, for example, gate terminals that are electrically connected to gate electrodes of the switching elements installed in the power module 8; and signal terminals that are electrically connected to a temperature sensor and a current sensor installed in the power module 8.

The cooler 22 at a right end in FIG. 2 is provided with a refrigerant supply port 28 and a refrigerant discharge port 29. The adjacent coolers 22 are connected by two coupling pipes 23. One of the coupling pipes 23 is positioned so as to overlap the refrigerant supply port 28 in a stacking direction. Although being hidden and not shown in FIG. 2 and FIG. 3, the other coupling pipe 23 is positioned so as to overlap the refrigerant discharge port 29 when seen in the stacking direction. A refrigerant circulator, which is not shown, is connected to the refrigerant supply port 28 and the refrigerant discharge port 29. A refrigerant that is supplied from the refrigerant supply port 28 is distributed to all of the coolers 22 through the one of the coupling pipes 23. While flowing through each of the coolers 22, the refrigerant absorbs heat from the power module 8 adjacent to the cooler 22. The refrigerant that has absorbed the heat is discharged from the stacked unit 20 through the other coupling pipe 23 and the refrigerant discharge port 29. Because each of the power modules 8 is cooled from both sides, the stacked unit 20 exhibits high cooling performance.

In each of the power modules 8, each of the three terminals 25a to 25c has a flat plate shape. The positive electrode terminals 25a of the plurality of power modules 8 are aligned in the stacking direction such that each of the positive electrode terminals 25a faces a flat surface of the positive electrode terminal 25a of the adjacent power module 8. The negative electrode terminals 25b of the plurality of power modules 8 are also aligned in the stacking direction such that each of the negative electrode terminals 25b faces a flat surface of the negative electrode terminal 25b of the adjacent power module 8. The same applies to the midpoint terminals 25c of the plurality of power modules 8. The positive electrode terminals 25a, the negative electrode terminals 25b, and the midpoint terminals 25c of the plurality of power modules 8 are aligned in three rows.

As described above, since the drive electric power for the travel motor of the electric vehicle 100 flows through the capacitor 60, the capacitor 60 is large in size. The capacitor 60 is long in the stacking direction of the coolers 22 and the power modules 8 in the stacked unit 20 (an X-direction in FIG. 2), and the capacitor 60 is disposed obliquely below the stacked unit 20 (the capacitor 60 is obliquely above the stacked unit 20 in FIG. 2 and FIG. 3). A capacitor element 61 (see FIG. 3) is accommodated in a case of the capacitor 60. The stacked unit 20 and the capacitor 60 are connected by the positive electrode bus bar 30 and the negative electrode bus bar 40. Note that an insulating plate 48 is held between the positive electrode bus bar 30 and the negative electrode bus bar 40. A tab 62 that is used to attach the capacitor 60 to a case is provided at each end of the capacitor 60 in a longitudinal direction.

FIG. 3 is an exploded perspective view of the assembly of the positive electrode bus bar 30, the negative electrode bus bar 40, the stacked unit 20, and the capacitor element 61 (the capacitor 60). In FIG. 3, the case of the capacitor 60 is not shown, and the capacitor element 61 in the case of the capacitor 60 is shown. The capacitor element 61 corresponds to the smoothing capacitor 6 in FIG. 1.

The positive electrode terminal 25a of each of the plurality of power modules 8 and a positive electrode 61a of the capacitor element 61 are connected by the positive electrode bus bar 30. The negative electrode terminal 25b of each of the plurality of power modules 8 and a negative electrode 61b of the capacitor element 61 are connected by the negative electrode bus bar 40.

The positive electrode bus bar 30 includes a flat plate portion 31 having a plate shape, a plurality of positive electrode terminal holes 32, and a plurality of branch portions 33. In FIG. 3, only the positive electrode terminal hole 32 and the branch portion 33 at the left end are denoted by the reference numerals, and the other positive electrode terminal holes and the other branch portions are not denoted by the reference numerals. The same applies to the negative electrode bus bar 40 and the insulating plate 48, which will be described below.

One end of a connection bus bar 63 is connected to one end of the flat plate portion 31. The other end of the connection bus bar 63 is connected to the positive electrode 61a of the capacitor element 61. The plurality of positive electrode terminal holes 32 are provided in the flat plate portion 31 of the positive electrode bus bar 30, and the branch portion 33 extends in a direction orthogonal to the flat plate portion 31 from an edge of each of the positive electrode terminal holes 32. The positive electrode terminal 25a of each of the power modules 8 is inserted through (i.e., passed through) the positive electrode terminal hole 32, and each of the positive electrode terminals 25a is joined to a corresponding one of the branch portions 33 by welding.

The negative electrode bus bar 40 includes a flat plate portion 41 having a plate shape, a plurality of negative electrode terminal holes 42, a plurality of branch portions 43, and a plurality of positive electrode terminal holes 44. One end of the flat plate portion 41 is connected to the negative electrode 61b of the capacitor element 61. The plurality of negative electrode terminal holes 42 are provided in the flat plate portion 41 of the negative electrode bus bar 40, and the branch portion 43 extends in a direction orthogonal to the flat plate portion 41 from an edge of each of the negative electrode terminal holes 42. The negative electrode terminal 25b of each of the power modules 8 is inserted through (i.e., passed through) the negative electrode terminal hole 42, and each of the negative electrode terminals 25b is joined to a corresponding one of the branch portions 43 by welding.

The insulating plate 48 is held between the positive electrode bus bar 30 and the negative electrode bus bar 40. The insulating plate 48 insulates the positive electrode bus bar 30 and the negative electrode bus bar 40 from each other. A plurality of through-holes 49 are provided in the insulating plate 48.

When the positive electrode bus bar 30, the insulating plate 48, and the negative electrode bus bar 40 overlap each other, the plurality of positive electrode terminal holes 44 of the negative electrode bus bar 40 overlap the plurality of through-holes 49 of the insulating plate 48, and the positive electrode terminals 25a of the power modules 8 and the branch portions 33 of the positive electrode bus bar 30 are inserted through (i.e., passed through) the overlapping through-holes. The positive electrode terminals 25a and the branch portions 33 are not in contact with the positive electrode terminal holes 44 of the negative electrode bus bar 40, and the positive electrode terminals 25a and the branch portions 33 are insulated from the positive electrode terminal holes 44.

Both of the flat plate portion 31 of the positive electrode bus bar 30 and the flat plate portion 41 of the negative electrode bus bar 40 have plate shapes, and are arranged close to each other so as to face each other. More specifically, the flat plate portion 31 and the flat plate portion 41 are stacked with the insulating plate 48 being held therebetween. The flat plate portion 31 of the positive electrode bus bar 30 and the flat plate portion 41 of the negative electrode bus bar 40 are arranged close to each other so as to extend in parallel from the capacitor 60 (the capacitor element 61) toward the stacked unit 20. When the current flows through one of the bus bars 30, 40, the current induces a magnetic field around the one bus bar. A magnitude of the magnetic field is positively correlated with inductance of the bus bar (as the magnetic field is increased, the inductance is increased). In the case where the flat plate portion 31 of the positive electrode bus bar 30 faces the flat plate portion 41 of the negative electrode bus bar 40, the magnetic field of the one bus bar induces an eddy current in the other bus bar. The generation of the eddy current weakens the magnetic field of the one bus bar. Weakening of the magnetic field means that the inductance is reduced. The inductance of each of the bus bars 30, 40 can be reduced by providing the flat plate portions 31, 41 of the bus bars 30, 40 close to each other such that the flat plate portions 31, 41 extend in parallel with each other.

Figure 4:
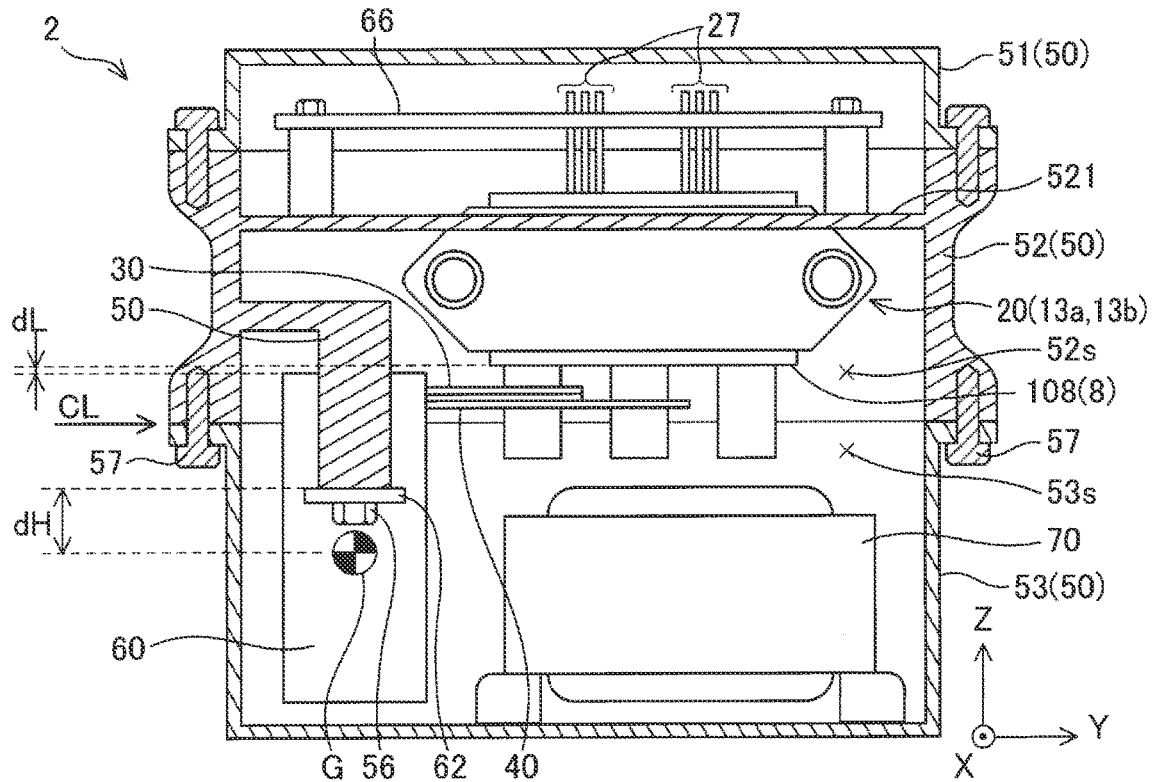
FIG. 4 is a sectional view of a component layout in a case of the power conversion device, the sectional view being taken along a Y-Z plane.
Figure 5:
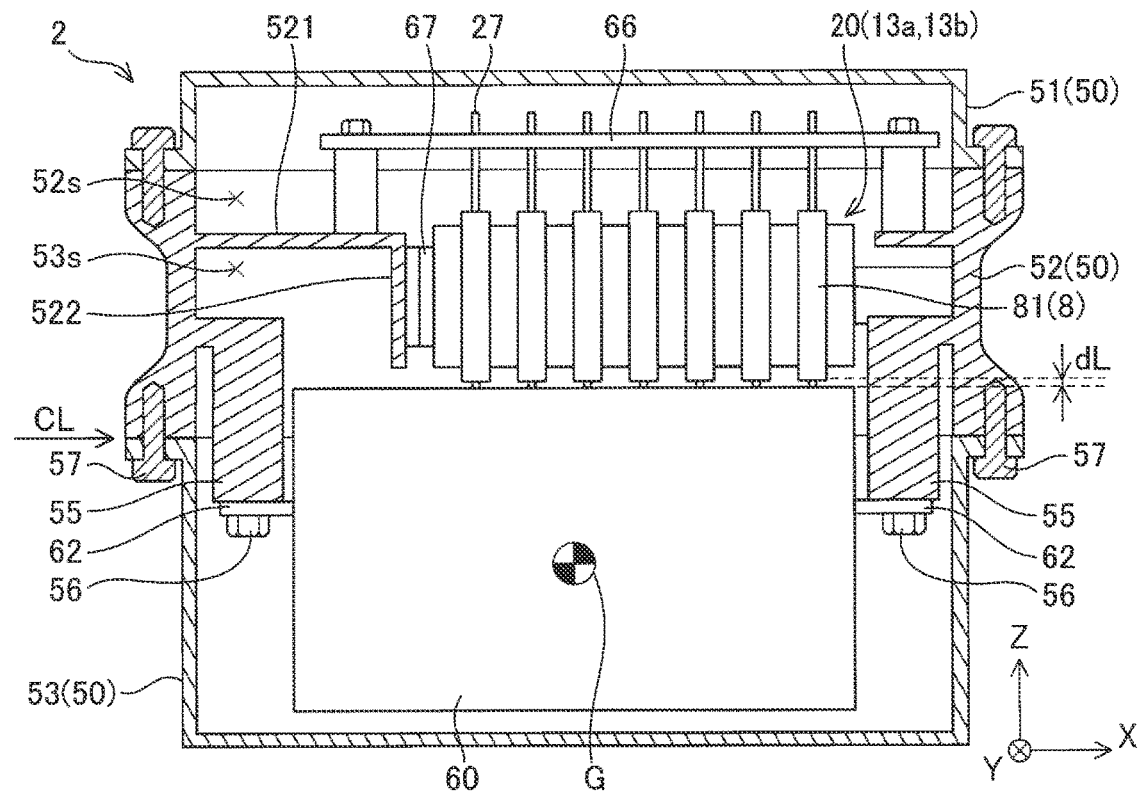
FIG. 5 is a sectional view of the component layout in the case of the power conversion device, the sectional view being taken along an X-Z plane.

A description will be provided on a component layout in the case of the power conversion device 2 with reference to FIG. 4 and FIG. 5. FIG. 4 is a sectional view obtained by cutting a side plate of a case 50 on a positive side of the X-axis in the coordinate system of FIG. 4. FIG. 5 is a sectional view obtained by cutting a side plate of the case 50 on a negative side of a Y-axis. The case 50 of the power conversion device 2 is divided into an upper case 52 and a lower case 53 in an up-down direction. In other words, the case 50 of the power conversion device 2 includes the upper case 52 and the lower case 53 arranged in the up-down direction. The lower case 53 is located under the upper case 52. Both of an upper side and a lower side of the upper case 52 are opened, and an upper opening of the upper case 52 is closed by an upper cover 51. The upper case 52 and the lower case 53 have substantially the same height. An internal space of the case 50 is divided, in the up-down direction, into substantially two halves by the upper case 52 and the lower case 53 (in other words, the internal space of the case 50 is divided into upper and lower portions by the upper case 52 and the lower case 53). The upper case 52 and the lower case 53 are fastened by bolts 57. An arrow CL in each of FIG. 4 and FIG. 5 indicates a boundary between the upper case 52 and the lower case 53.

A control board 66, the stacked unit 20, and the capacitor 60 are fixed to the upper case 52. A reactor 70 is fixed to the lower case 53. The reactor 70 corresponds to the reactor 7 in FIG. 1.

The upper case 52 is provided with a divider 521 that divides an internal space 52s of the upper case 52 in the up-down direction (in other words, divides the internal space 52s into upper and lower portions). The control board 66 is fixed at a position above the divider 521, and the stacked unit 20 is fixed at a position below the divider 521. A circuit is installed in the control board 66 and controls the switching elements 9a to 9h in FIG. 1 and the switching elements embedded in the power modules 8e to 8g. The control terminals 27 that extend from the plurality of power modules 8 are connected to the control board 66. The stacked unit 20 is fixed at a position below the divider 521. The stacked unit 20 and a plate spring (i.e., leaf spring) 67 are held between a support wall 522 that extends in the up-down direction from the divider 521 and an inner wall of the upper case 52. The plurality of power modules 8 and the plurality of coolers 22 are accommodated in the upper case 52 while the plate spring 67 applies a load to the power modules 8 and the coolers 22 in the stacking direction. Due to the load in the stacking direction, each of the power modules 8 and the coolers 22 that are adjacent to the power module 8 are tightly fitted (i.e., closely attached). Thus, the cooling performance of the stacked unit 20 is improved.

The capacitor 60 is disposed obliquely below the stacked unit 20. The capacitor 60 is fastened to a lower end of each of projections 55 by a bolt 56, and each of the projections 55 extends from an inner surface of the upper case 52. Each of the projections 55 extends from the inner surface of the upper case 52 and is bent downward at an intermediate position of the projection 55. The projection 55 may be regarded as one example of a fastening portion according to the disclosure. Each of the projections 55 extends from the internal space 52s of the upper case 52 to an internal space 53s of the lower case 53, and the lower end of the projection 55 reaches the internal space 53s of the lower case 53. The capacitor 60 is accommodated in the internal space 53s of the lower case 53 while being supported by the upper case 52. In the internal space 53s of the lower case 53, the capacitor 60 is fastened to the projections 55 of the upper case 52. Each of the tabs 62 on side surfaces of the capacitor 60 is fastened to the lower end of the projection 55 by the bolt 56. Each end of the capacitor 60 in the longitudinal direction is fastened to the projection 55 by the bolt 56.

A description will be provided on advantages of the above-described component layout in the case 50 of the power conversion device 2. As described above, the capacitor 60 is accommodated in the lower case 53 while being fastened to the projections 55 of the upper case 52. The stacked unit 20 is accommodated in the upper case 52. Since the stacked unit 20 and the capacitor 60, each of which is large in size, are separately accommodated in the upper case 52 and the lower case 53, a ratio of width (length in a Y-direction) of the case 50 to height of the case 50 can be reduced.

In the internal space 53s of the lower case 53, the capacitor 60 is fastened to the lower end of each of the projections 55 by the bolt 56. As shown in FIG. 4, the ratio of the width (the length in the Y-direction) of the case 50 to the height of the case 50 is approximately 1. Thus, the stacked unit 20 and the capacitor 60 cannot be aligned in a horizontal direction. In addition, the stacked unit 20 and the capacitor 60 are connected by the positive electrode bus bar 30 and the negative electrode bus bar 40. Thus, if the stacked unit 20 is fixed to the upper case 52 and the capacitor 60 is fixed to the lower case 53, assembling efficiency is degraded. It is desired to fix both of the stacked unit 20 and the capacitor 60 to the upper case 52 or the lower case 53. If an upper end of the capacitor 60 is fixed to the upper case 52, the capacitor 60 is supported at the upper end in a cantilevered manner. In this case, a distance from a cantilevered support position (i.e., a position at which the capacitor 60 is supported in the cantilevered manner) to the center of gravity G of the capacitor 60 is increased. Since the power conversion device 2 is mounted in the vehicle, the power conversion device 2 receives strong vibrations during travel. In the case where a distance from the fastened position of the capacitor 60 (i.e., the fastened position of the capacitor 60 supported in the cantilevered manner) to the center of gravity G of the capacitor 60 is long, the capacitor 60 exhibits a poor anti-vibration characteristic against the vibrations in the Y-direction of FIG. 4 and FIG. 5.

In the power conversion device 2 of the first embodiment, each of the tabs 62 of the capacitor 60 is located at substantially the center of the capacitor 60 in the up-down direction. Each of the fastened positions (the tabs 62) of the capacitor 60 is close to the center of gravity G of the capacitor 60 in the up-down direction. Length dH in FIG. 4 represents a distance between the center of gravity G and each of the fastened positions (the tabs 62) of the capacitor 60 in a height direction. The distance dH is much shorter than a distance from the center of gravity G of the capacitor 60 to the upper end of the capacitor 60. Therefore, in the power conversion device 2 of the embodiment, the capacitor 60 exhibits a good anti-vibration characteristic against the vibrations in the Y-direction in FIG. 4 and FIG. 5.

Note that a clearance dL is secured between the package 108 of the power modules 8 and the capacitor 60. In other words, the package 108 and the capacitor 60 are arranged so as to be separated in the up-down direction with the clearance dL being provided therebetween when seen in a direction of an X-Y plane (that is, in a horizontal direction) in FIG. 4 and FIG. 5. Thus, at a position between the positive electrode terminals 25a of the power modules 8 and the capacitor 60, the positive electrode bus bar 30 has a linear shape. Similarly, at a position between the negative electrode terminals 25b and the capacitor 60, the negative electrode bus bar 40 has a linear shape. The linear shapes of the bus bars (the positive electrode bus bar 30 and the negative electrode bus bar 40) between the power modules 8 and the capacitor 60 contribute to suppression of parasitic inductance of each of the bus bars.

Figure 6:
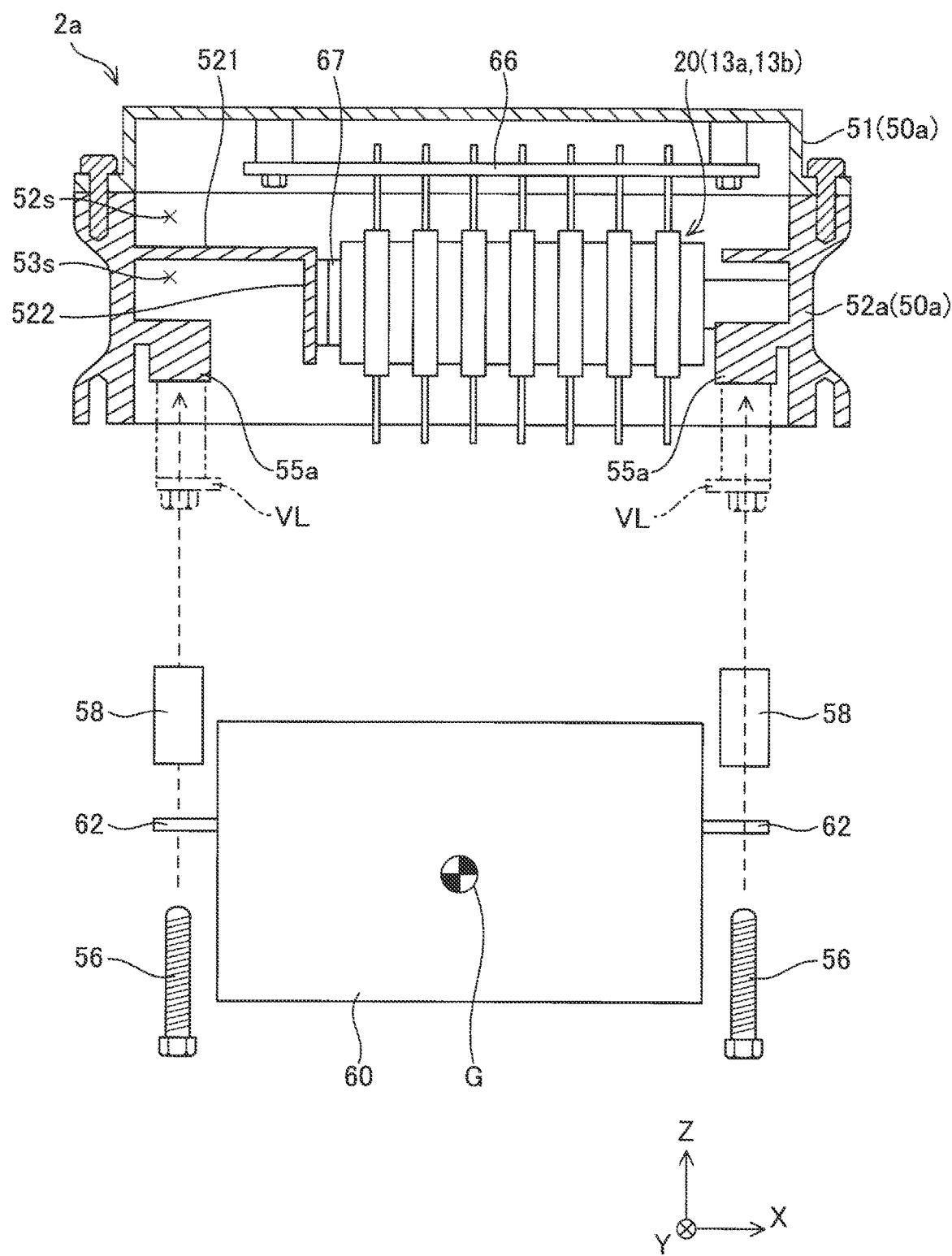
FIG. 6 is a sectional view of a component layout in a case of a power conversion device according to a first modified example, the sectional view being taken along the X-Z plane.

FIG. 6 is a sectional view of a power conversion device 2a according to a first modified example. FIG. 6 is the sectional view which corresponds to FIG. 5, the sectional view being obtained by cutting a side plate of a case 50a on the negative side of the Y-axis. Note that FIG. 6 is a view illustrating a state where the lower case is removed and the capacitor 60 is detached from an upper case 52a.

Projections 55a are provided in the upper case 52a such that lower ends of the projections 55a are located in the internal space 52s of the upper case 52a. The capacitor 60 is fastened to the projections 55 by the bolts 56 with spacers 58 being held between the capacitor 60 and the projections 55. In the first modified example, the projection 55 and the spacer 58 may be regarded as one example of the fastening portion according to the disclosure. Each of the spacers 58 is a cylinder, and the bolt 56 is inserted through (i.e., passed through) the spacer 58. Lower ends of the spacers 58 are fastened positions at which the capacitor 60 is fastened. As indicated by an imaginary line VL in FIG. 6, each of the fastened positions is located below the internal space 52s of the upper case 52a. That is, also in this first modified example, the capacitor 60 is accommodated in the internal space of the lower case. In the internal space of the lower case, the capacitor 60 is fixed to the projections 55a extending from the upper case 52a, via the spacers 58. A component layout in the power conversion device 2a according to the first modified example has the same effects as the above-described effects of the component layout in the power conversion device 2.

Figure 7:
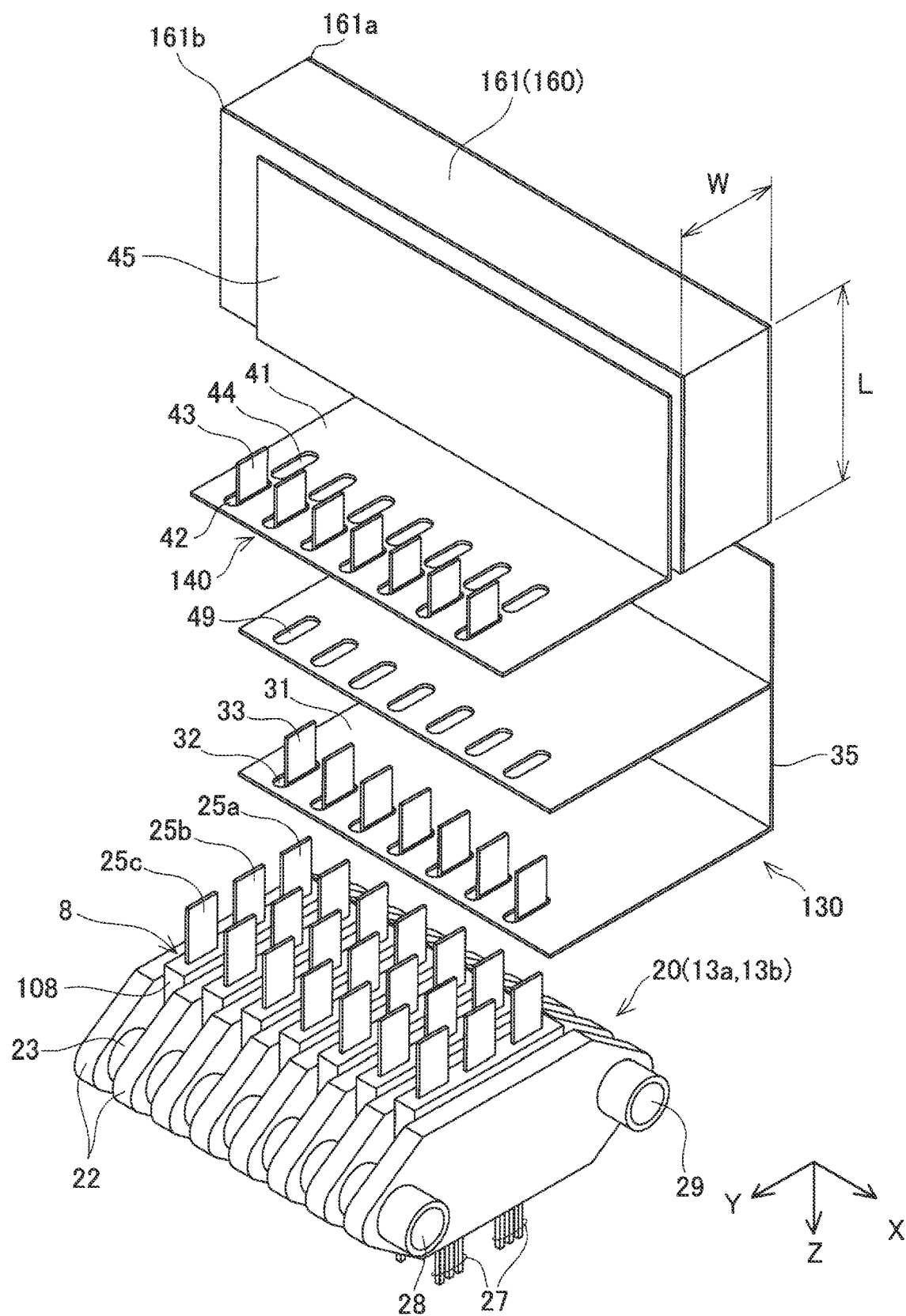
FIG. 7 is an exploded perspective view of an assembly of a capacitor, a stacked unit, and bus bars in a power conversion device according to a second embodiment.
Figure 8:
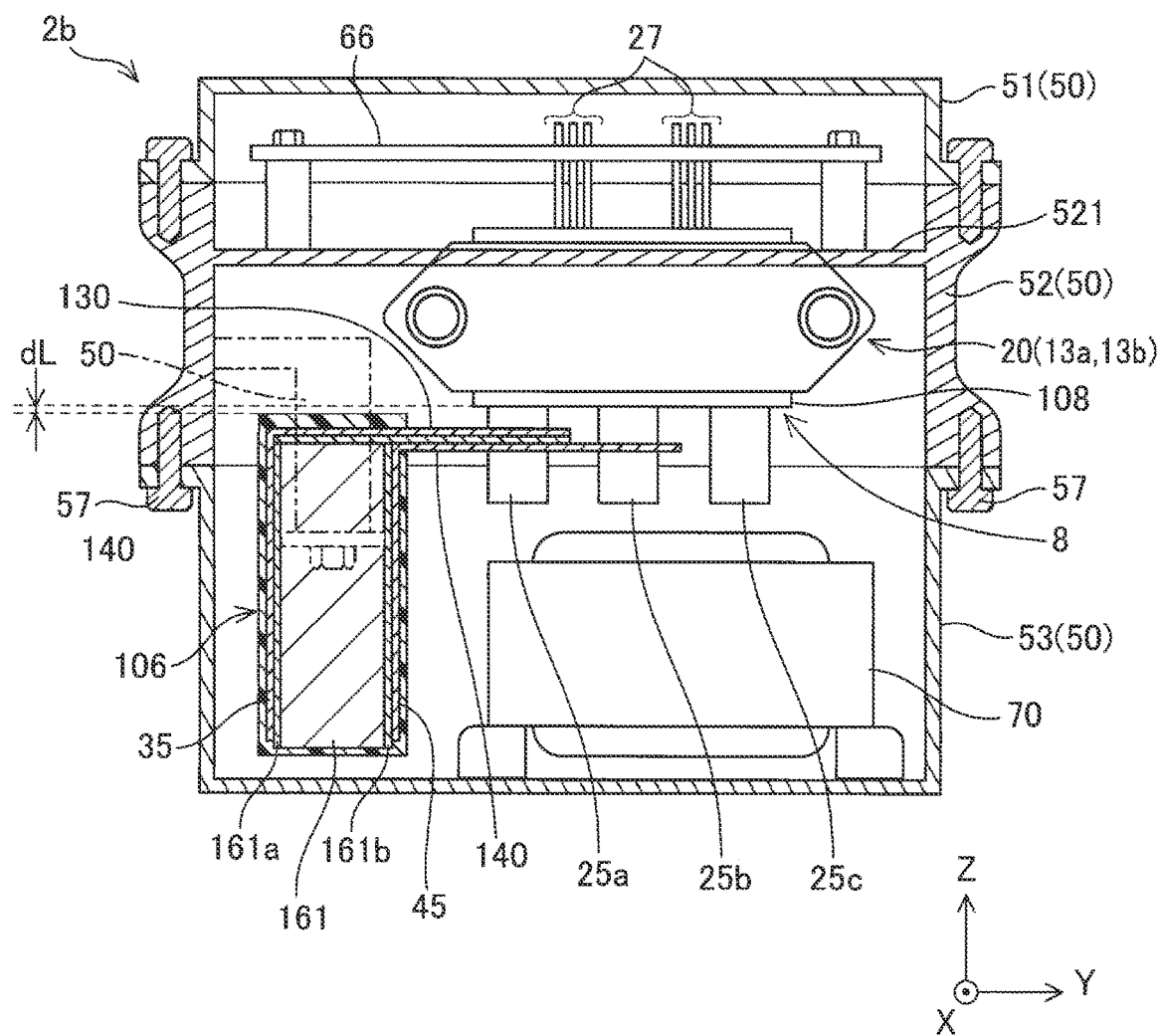
FIG. 8 is a sectional view of the power conversion device according to the second embodiment, the sectional view being taken along the Y-Z plane.
Figure 9:
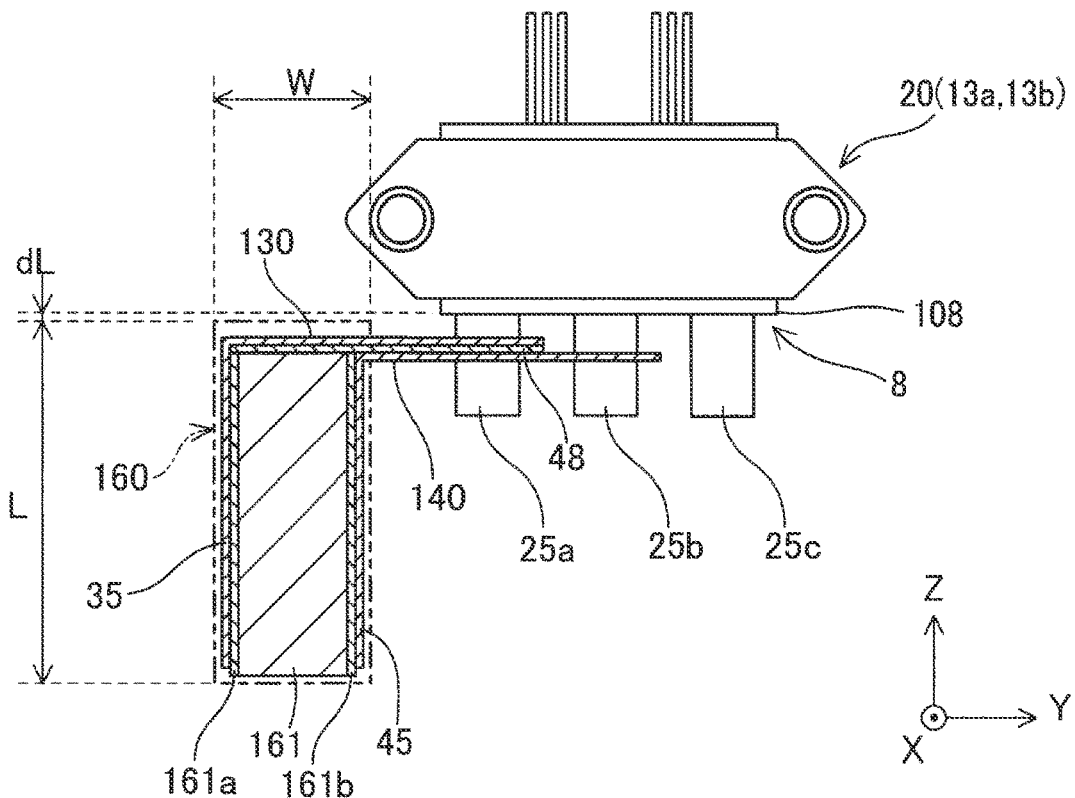
FIG. 9 is a side view of the assembly of the capacitor, the stacked unit, and the bus bars.

A description will be provided on a power conversion device 2b according to a second embodiment with reference to FIG. 7 to FIG. 9. Shapes of a positive electrode bus bar 130 and a negative electrode bus bar 140 and a structure of a capacitor element 161 (a capacitor 160) in the power conversion device 2b according to the second embodiment differ from those in the power conversion device 2 according to the first embodiment. Because the other structure of the power conversion device 2b is the same as that of the power conversion device 2 according to the first embodiment, the description thereof will not be provided.

FIG. 7 is an exploded perspective view of the bus bars 130, 140, the capacitor element 161, and the stacked unit 20 of the power conversion device 2b. The stacked unit 20 is the same as that in FIG. 3. When the capacitor element 161 is seen in the X-direction of FIG. 7, a length W of the capacitor element 161 in a lateral direction is less than a length L thereof in the vertical direction. In other words, in a section of the capacitor element 161 (the capacitor 160) that crosses (i.e., that is orthogonal to) the stacking direction of the power modules 8 (i.e., the X-direction in FIG. 7), the length W of the capacitor element 161 in the lateral direction is less than the length L thereof in the vertical direction. In this point, the capacitor element 161 is the same as the capacitor element 61 of the power conversion device 2 in the first embodiment. Electrodes 161a, 161b are arranged on side surfaces of the capacitor element 161, the side surfaces facing in the lateral direction of the capacitor element 161. Note that, in the capacitor element 61 of the first embodiment, the electrodes 61a, 61b are respectively arranged on an upper surface and a lower surface of the capacitor element 61. An electrode joined portion 35 of the positive electrode bus bar 130 is joined to the positive electrode 161a of the capacitor element 161, and an electrode joined portion 45 of the negative electrode bus bar 140 is joined to the negative electrode 161b.

FIG. 9 is a side view of an assembly of the capacitor 160, the stacked unit 20, and the bus bars 130, 140 in the power conversion device 2b according to the second embodiment. In FIG. 9, a case of the capacitor 160 is indicated by an imaginary line, and a section of an internal structure of the capacitor 160 is shown.

The clearance dL is provided between the package 108 of the power modules 8 and the capacitor 160. That is, in other words, the package 108 and the capacitor 160 are arranged so as to be separated from each other in the up-down direction with the clearance dL being provided between the package 108 and the capacitor 160 when seen in the direction of the X-Y plane (that is, the horizontal direction) in FIG. 9. Similarly to the power conversion device 2 of the first embodiment, at a position between the positive electrode terminals 25a of the power modules 8 and the capacitor 160, the positive electrode bus bar 130 has a linear shape. At a position between the negative electrode terminals 25b and the capacitor 160, the negative electrode bus bar 140 also has a linear shape. At the position between the terminals 25a, 25b and the capacitor 160, the positive electrode bus bar 130 and the negative electrode bus bar 140 are arranged close to each other so as to extend in parallel. Since the positive electrode bus bar 130 and the negative electrode bus bar 140 are arranged close to each other so as to extend in parallel, inductance of each of the bus bars 130, 140 is reduced.

The electrodes 161a, 161b of the capacitor element 161 are arranged on the side surfaces of the capacitor element 161, the side surfaces facing in the lateral direction thereof. As described above, when the positive electrode bus bar and the negative electrode bus bar are arranged close to each other so as to extend in parallel, the inductance of each of bus bars is reduced. As shown in FIG. 9, in the case of the power conversion device 2b according to the second embodiment, the positive electrode bus bar 130 and the negative electrode bus bar 140 are not close to each other and do not extend in parallel only on an upper side of the capacitor element 161 except for the electrode joined portions 35, 45. That is, the bus bars 130, 140 have a nonparallel arrangement zone having the length (distance) W.

Figure 10:
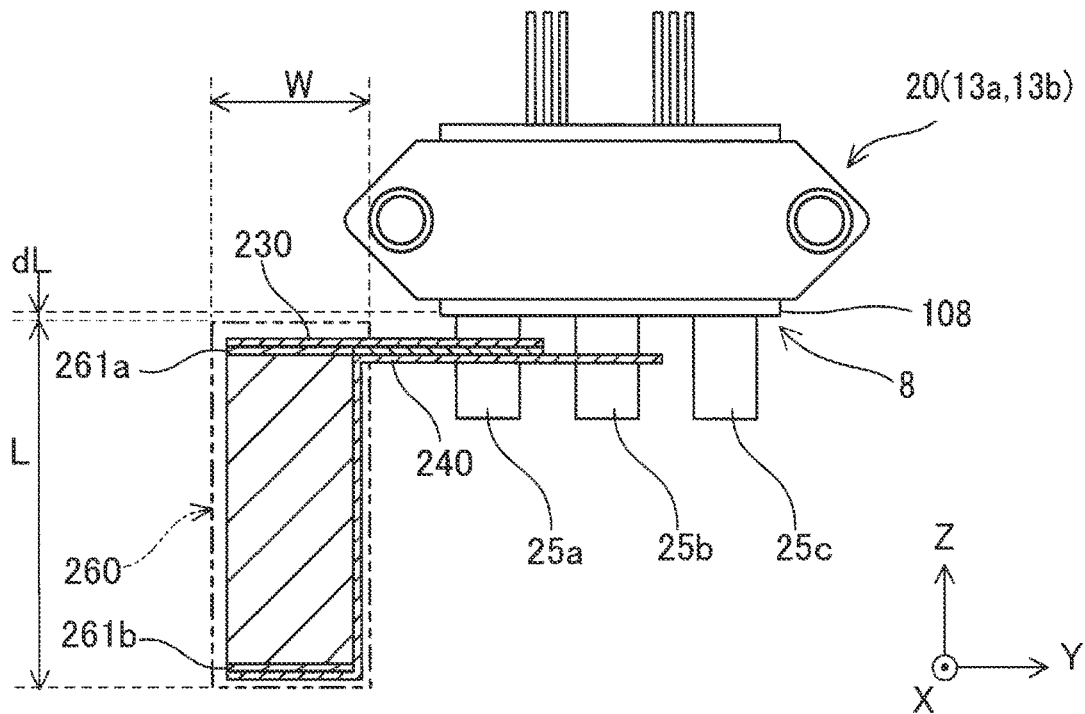
FIG. 10 is a side view of an assembly of a capacitor, a stacked unit, and bus bars in a power conversion device according to a second modified example.

FIG. 10 is a side view of an assembly in a power conversion device according to a second modified example. In the second modified example shown in FIG. 10, electrodes 261a, 261b are respectively arranged on an upper side and a lower side of a capacitor element 261. In this case, a positive electrode bus bar 230 and a negative electrode bus bar 240 have a nonparallel arrangement zone located on a side of the capacitor element 261 except for electrode joined portions. That is, in the second modified example shown in FIG. 10, the bus bars 230, 240 have the nonparallel arrangement zone having the length (distance) L. In the power conversion device shown in each of FIG. 9 and FIG. 10, the length W of the capacitor element 161 or 261 in the lateral direction is less than the length L thereof in the vertical direction. Thus, when the structure shown in FIG. 9, that is, the capacitor element 161 is adopted, the nonparallel arrangement zone of the bus bars 130, 140 can be shortened. The electrodes 161a, 161b are arranged on the side surfaces of the capacitor element 161, the side surfaces facing in the lateral direction. This point also contributes to reducing the inductance of each of the bus bars 130, 140.

A description will be provided on other characteristics of the power conversion devices 2, 2a, 2b. As shown in FIG. 4 and FIG. 5, the upper case 52 and the lower case 53 are fixed by bolts 57. The bolts 57 are inserted from the lower side. This characteristic contributes to increasing a volume of the space of the upper case 52 accommodating the board 66 without increasing a volume of the entire case 50.

Points to be noted with regard to the technique described in the embodiments will be described. As shown in FIG. 1, the main components that constitute the inverter circuits 13a, 13b are accommodated in the stacked unit 20. Thus, the stacked unit 20 can be referred to as an "inverter". The inverters 13a, 13b (the stacked unit 20) and the capacitor 60 are fixed to the upper case 52 of the case 50, the inverters 13a, 13b (the stacked unit 20) and the capacitor 60 being connected by the bus bars 30, 40. The inverters 13a, 13b (the stacked unit 20) are accommodated in the upper case 52, and the capacitor 60 is accommodated in the lower case 53. The capacitor 60 is fastened to the lower end of each of the projections 55. The lower end of each of the projections 55 extends from the upper case 52 and reaches the internal space 53s of the lower case 53.

The power conversion device 2 according to the embodiment includes the case 50. The case 50 includes the upper case 52 and the lower case 53 that are arranged in the up-down direction. The stacked unit 20 and the capacitor 60 are fixed to the upper case 52. The capacitor 60 is fixed to the lower end of each of the projections 55 by the bolt 56. Each of the projections 55 extends from the internal space 52s of the upper case 52 to the internal space 53s of the lower case 53. The capacitor 60 is accommodated in the internal space 53s of the lower case 53 while being fastened to the upper case 52. In the internal space 53s of the lower case 53, the capacitor 60 is fastened at substantially the center (the tabs 62) thereof in the up-down direction. Thus, the capacitor 60 exhibits the good anti-vibration characteristic against lateral vibrations.

Even in the case where the case 50 in FIG. 4 and FIG. 5 (the case 50a in FIG. 6) is reversed in the up-down direction (i.e., even in the case where the case 50 in FIG. 4 and FIG. 5 is turned upside down), the same effect regarding the anti-vibration characteristic of the capacitor 60 can be obtained. In the case where the case 50 in FIG. 4 and FIG. 5 is reversed in the up-down direction, the upper case 52 corresponds to the lower case, and the lower case 53 corresponds to the upper case. Thus, the technique of the embodiment can be expressed as follows. The power conversion device includes the case divided into the upper case and the lower case (i.e., the case including the upper case and the lower case). One of the upper case and the lower case is referred to as a first partial case, and the other of the upper case and the lower case is referred to as a second partial case. The stacked unit 20 and the capacitor 60 are connected by the positive electrode bus bar 30 and the negative electrode bus bar 40, and both of the stacked unit 20 and the capacitor 60 are fixed to the first partial case. The stacked unit 20 is accommodated in the internal space of the first partial case, and the capacitor 60 is accommodated in the second partial case. In the internal space of the second partial case, the capacitor 60 is fastened to the projections 55 extending from the internal space of the first partial case.

In the power conversion device 2 (2b) of the embodiment, the stacked unit 20 is disposed above the capacitor 60 (160). The package 108 and the capacitor 60 (160) are separated from each other with the clearance dL being provided between the package 108 and the capacitor 60 (160). At the position between the power modules 8 and the capacitor 60 (160), the positive electrode bus bar 30 (130) and the negative electrode bus bar 40 (140) extend linearly in parallel with each other. This characteristic contributes to reducing the inductance of each of the bus bars 30, 40 (130, 140). Even when the stacked unit 20 is disposed below the capacitor 60 (160) and the package 108 and the capacitor 60 (160) are separated from each other with the clearance dL being provided between the package 108 and the capacitor 60 (160), the same effect can be obtained. The clearance dL may be a short distance.

The embodiments of the disclosure have been described in detail. However, the embodiments are merely illustrative and do not limit the scope of the disclosure. The disclosure includes various modifications and changes that are made to the embodiments described so far. The technical elements described in the disclosure demonstrate technical utility when used singly or in various combinations, and thus the combinations of the technical elements are not limited to the combinations described in the disclosure. In addition, the techniques that are described in the disclosure achieve a plurality of objects simultaneously, and technical utility is provided by achieving at least one of the objects.

What is claimed is:
1. A power conversion device comprising:
a case including an upper case and a lower case;
an inverter that is accommodated in a first partial case and is fixed to the first partial case, the first partial case being one of the upper case and the lower case; and
a capacitor that is connected to the inverter by a positive electrode bus bar and a negative electrode bus bar, the capacitor being disposed in an internal space of a second partial case that is another of the upper case and the lower case, wherein the first partial case includes a fastening portion that extends from an internal space of the first partial case to the internal space of the second partial case, and in the internal space of the second partial case, the capacitor is fastened to the fastening portion.

2. The power conversion device according to claim 1, wherein the positive electrode bus bar and the negative electrode bus bar are arranged close to each other so as to extend in parallel from the capacitor toward the inverter.

3. The power conversion device according to claim 1, wherein:

the inverter includes a stacked body including a plurality of power modules and a plurality of coolers;

each of the power modules includes a package and a plurality of terminals, the package accommodating a switching element, and each of the plurality of terminals extending from the package and being connected to the positive electrode bus bar or the negative electrode bus bar; and a clearance is provided between the package and the capacitor when the package and the capacitor are seen in a horizontal direction.

4. The power conversion device according to claim 3, wherein:

in a section of the capacitor that is orthogonal to a stacking direction of the plurality of power modules, a length of the capacitor in a lateral direction is less than a length of the capacitor in a vertical direction; and electrodes that are connected to the positive electrode bus bar and the negative electrode bus bar are arranged on side surfaces of the capacitor, the side surfaces facing in the lateral direction.

* * * * *